US006765801B1

(12) United States Patent
Glenn et al.

(10) Patent No.: US 6,765,801 B1
(45) Date of Patent: Jul. 20, 2004

(54) OPTICAL TRACK DRAIN PACKAGE

(75) Inventors: Thomas P. Glenn, Gilbert, AZ (US);
Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 191 days.

(21) Appl. No.: 09/891,678

(22) Filed: Jun. 25, 2001

(51) Int. Cl.[7] .................................................. H05K 1/18
(52) U.S. Cl. ........................ 361/764; 361/761; 174/52.2
(58) Field of Search ................................. 361/760–764, 361/782–784; 174/52.2, 259–261; 257/686–690, 723–724, 787–792; 438/112–116

(56) References Cited

U.S. PATENT DOCUMENTS

| 5,147,982 | A | * | 9/1992 | Steffen | 174/52.2 |
| 5,689,089 | A | * | 11/1997 | Polak et al. | 174/52.4 |
| 6,111,199 | A | * | 8/2000 | Wyland et al. | 174/52.2 |
| 6,151,344 | A | | 11/2000 | Kiely et al. | 372/38 |
| 6,191,494 | B1 | * | 2/2001 | Ooyama et al. | 257/796 |
| 6,534,711 | B1 | * | 3/2003 | Pollack | 174/52.2 |

* cited by examiner

Primary Examiner—Kamand Cuneo
Assistant Examiner—Tuan Dinh
(74) Attorney, Agent, or Firm—Gunnison, McKay & Hodgson, L.L.P.; Serge J. Hodgson

(57) ABSTRACT

A package includes a substrate having a pocket, an overflow reservoir around a periphery of the pocket, and a mating surface around a periphery of the overflow reservoir. An electronic component is mounted within the pocket. The pocket is over filled with a flowable material. A window or waveguide is mounted to the substrate. The overflow reservoir captures the flowable material that spills out of the pocket during mounting of the window or waveguide thus preventing contamination of the mating surface.

20 Claims, 5 Drawing Sheets

OPTICAL TRACK DRAIN PACKAGE

BACKGROUND OF THE INVENTION

1. Field of the Invention

The present invention relates generally to the packaging of electronic components. More particularly, the present invention relates to a method of fabricating an electronic component package and the resulting electronic component package.

2. Description of the Related Art

Optical chips, which transmitted or received electromagnetic radiation, are well known to those of skill in the art. These optical chips were packaged to protect the optical chips while at the same time to facilitate electrical interconnection with the optical chips.

Packaging of optical chips presented unique challenges. The optical chips had to be packaged in a manner that prevented significant distortion of the transmitted or received electromagnetic radiation. Further, the optical chips had to be packaged in a manner that prevented undesirable reflection or absorption of the transmitted or received electromagnetic radiation.

SUMMARY OF THE INVENTION

In accordance with the present invention, an electronic component package includes a substrate having a pocket, an overflow reservoir around a periphery of the pocket, and a mating surface around a periphery of the overflow reservoir. An electronic component is coupled within the pocket. A sealing encapsulant fills the pocket and encloses the electronic component, the sealing encapsulant having an exterior surface coplanar with the mating surface of the substrate. Further, excess encapsulant is within the overflow reservoir.

Advantageously, by forming the substrate with a pocket, and mounting the electronic component within the pocket, the electronic component package is made relatively thin. Accordingly, the electronic component package is well suited for use with small and lightweight electronic devices, which require thin packages.

In one embodiment, the spacing between the exterior surface of the sealing encapsulant and an upper surface of the electronic component is relatively small, e.g., 150 $\mu$m. Due to this relatively small spacing, another structure such as a window or waveguide brought into abutting contact with the exterior surface of the sealing encapsulant is placed extremely close to and at a fixed spacing from the electronic component.

In one embodiment, the electronic component transmits or receives electromagnetic radiation. Due to the relatively small thickness of the sealing encapsulant through which the electromagnetic radiation passes, there is essentially no loss of electromagnetic radiation associated with the sealing encapsulant. Further, by forming the exterior surface of the sealing encapsulant as a planar surface, the sealing encapsulant does not distort the electromagnetic radiation passing through the sealing encapsulant.

Also in accordance with the present invention, a method of forming an electronic component package includes coupling an electronic component within a pocket of a substrate. The pocket is over filled with a flowable material. The flowable material is squeezed between a structure such as a window or waveguide and the substrate. A volume of the flowable material overflows the pocket during the squeezing. Advantageously, the volume of the flowable material is captured in an overflow reservoir thus preventing contamination of a mating surface of the substrate. The flowable material is cured to form a sealing encapsulant that fills the pocket and protects the electronic component.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
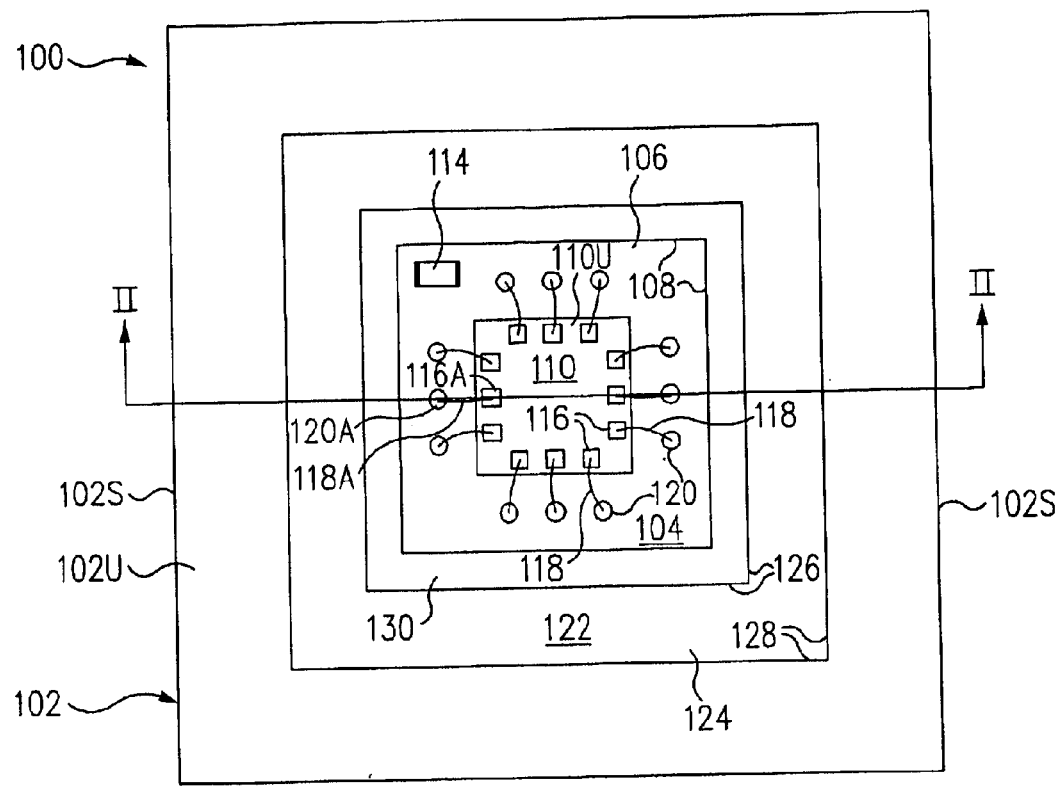
FIG. 1 is a top plan view of an electronic component package in accordance with one embodiment of the present invention.

A substrate 102 (FIG. 6) is formed with an overflow reservoir 122 around a periphery of a pocket 104. Pocket 104 is over filled with a flowable material 602. Overflow reservoir 122 (FIG. 7) captures the volume of flowable material 602 that spills out of pocket 104 during mounting of a window 310 thus preventing flowable material 602 from contaminating a mating surface 102U of substrate 102. Advantageously, window 310 (FIG. 8) is placed extremely close to and at a fixed distance from an active area 302 of an electronic component 110A.

Figure 2:
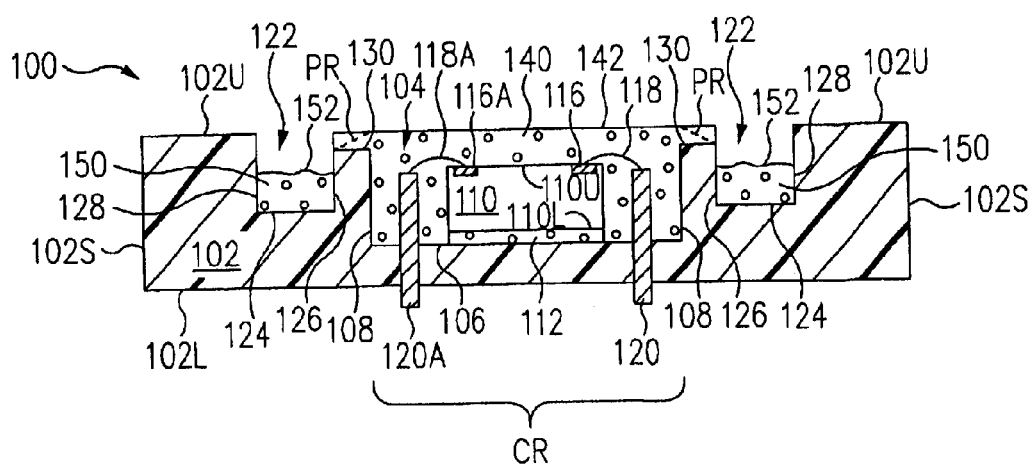
FIG. 2 is a cross-sectional view of the electronic component package along the line II—II of FIG. 1.

More particularly, FIG. 1 is a top plan view of an electronic component package 100, hereinafter package 100, in accordance with one embodiment of the present invention. FIG. 2 is a cross-sectional view of package 100 along the line II—II of FIG. 1. Referring now to FIGS. 1 and 2 together, package 100 includes a substrate 102. Illustratively, substrate 102 is molded plastic, ceramic, liquid crystal polymer (LCP), tape, or printed circuit board material although other materials are used in other embodiments.

Substrate 102 includes a pocket 104. From the view of FIG. 1, pocket 104 is a rectangular, e.g., square, pocket although pocket 104 is formed in other shapes, e.g., circular or oval, in other embodiments. Substrate 102 further includes a pocket base surface 106 and a pocket sidewall surface 108, which define pocket 104.

Located within pocket 104 is an electronic component 110. Electronic component 110 includes an upper, e.g., first, surface 110U and a lower, e.g., second, surface 110L. Lower surface 110L is mounted to pocket base surface 106 by an adhesive layer 112 such that pocket 104 contains electronic component 110.

Generally, at least one electronic component 110 is mounted within pocket 104. For example, as shown in FIG. 1, a second electronic component 114 is mounted within pocket 104. However, in alternative embodiments, more or less than two electronic components are mounted within pocket 104.

The electronic components are mounted within pocket 104 in various configurations. For example, electronic component 110 is mounted with adhesive layer 112 in a wirebond configuration. Electronic component 114 is mounted in a surface mount configuration, e.g., using solder joints, as those of skill in the art will understand. However, in alternative embodiments, electronic component 110 and/or electronic component 114 are mounted in flip chip configurations, as those of skill in the art will understand.

Referring still to the embodiment illustrated in FIGS. 1 and 2, bond pads 116 of electronic component 110 are on upper surface 110U. Bond pads 116 are electrically connected to the internal circuitry (not shown) of electronic component 110. Bond wires 118 electrically connect bond pads 116 to corresponding pins 120.

To illustrate, a first bond pad 116A of the plurality of bond pads 116 is electrically connected by a first bond wire 118A of the plurality of bond wires 118 to a first pin 120A of the plurality of pins 120. The other bond pad 116 are electrically connected by the other bond wires 118 to the other pins 120 in a similar manner and so are not discussed further to avoid detracting from the principals of the invention.

Pins 120 extend through pocket base surface 106, through substrate 102, through a lower, e.g., first, surface 102L of substrate 102 and protrude from lower surface 102L. Pins 120 are used to electrically connect package 100 to the larger substrate, e.g., to the printed circuit mother board. Although pins 120 are described and illustrated in FIGS. 1 and 2, in alternative embodiments, electrical structures other than pins 120 are used as described in greater detail below with reference to FIG. 5.

Advantageously, by forming substrate 102 with a pocket 104, and mounting electronic components 110, 114 within pocket 104, package 100 is made relatively thin. Accordingly, package 100 is well suited for use with small and lightweight electronic devices, which require thin packages.

Substrate 102 further includes an overflow reservoir 122, sometimes called a track drain. In the view of FIG. 1, i.e., when viewed from above, overflow reservoir 122 is a rectangular, e.g., square, annulus around the entire periphery of pocket 104. However, in alternative embodiments, overflow reservoir 122 has other shapes when viewed from above, e.g., is oval or circular. In the view of FIG. 2, i.e., in cross-section, overflow reservoir 122 is rectangular, e.g., square, but has other shapes in other embodiments.

Overflow reservoir 122 is defined by a drain base surface 124, a drain inner sidewall surface 126, and a drain outer sidewall surface 128 of substrate 102. Substrate 102 further includes a runner surface 130 extending between drain inner sidewall surface 126 of overflow reservoir 122 and pocket sidewall surface 108 of pocket 104. More generally, runner surface 130 extends between pocket 104 and overflow reservoir 122.

Substrate 102 further includes a mating surface 102U extending outward from drain outer sidewall surface 128 of overflow reservoir 122. More generally, mating surface 102U is formed outwards of overflow reservoir 122 and is around the periphery of overflow reservoir 122. Mating surface 102U is sometimes called an upper, e.g., second, surface of substrate 102. Substrate 102 further includes a side 102S extending between mating surface 102U and lower surface 102L of substrate 102.

Referring now to FIG. 2, lower surface 102L, mating surface 102U, drain base surface 124, runner surface 130 and pocket base surface 106 are parallel to one another. Further, side 102S, drain outer sidewall surface 128, drain inner sidewall surface 126 and pocket sidewall surface 108 are parallel to one another. Still further, lower surface 102L, mating surface 102U, drain base surface 124, runner surface 130 and pocket base surface 106 are perpendicular to side 102S, drain outer sidewall surface 128, drain inner sidewall surface 126 and pocket sidewall surface 108.

Although various items may be described as being parallel or perpendicular to one another, it is understood that the items may not be exactly parallel or perpendicular but only substantially parallel or perpendicular to within accepted manufacturing tolerances.

As shown in FIG. 2, runner surface 130 is located vertically between mating surface 102U and lower surface 102L. Generally, runner surface 130 is below mating surface 102U. Stated another way, a plane defined by runner surface 130 is spaced apart from and below a plane defined by mating surface 102U.

Drain base surface 124 and pocket base surface 106 are located vertically between runner surface 130 and lower surface 102L. Generally, drain base surface 124 and pocket base surface 106 are below runner surface 130. Stated another way, a plane defined by drain base surface 124 is spaced apart from and below the plane defined by runner surface 130 and a plane defined by pocket base surface 106 is spaced apart from and below the plane defined by runner surface 130.

In this embodiment, pocket base surface 106 is located vertically between drain base surface 124 and lower surface 102L, i.e., pocket base surface 106 is below drain base surface 124. Stated another way, a plane defined by pocket base surface 106 is spaced apart from and below a plane defined by drain base surface 124.

However, in an alternative embodiment, drain base surface 124 is located vertically between pocket base surface 106 and lower surface 102L, i.e., drain base surface 124 is below pocket base surface 106. Stated another way, a plane defined by drain base surface 124 is spaced apart from and below a plane defined by pocket base surface 106. In yet another alternative embodiment, drain base surface 124 is parallel and coplanar with pocket base surface 106, i.e., neither drain base surface 124 nor pocket base surface 106 is below the other.

Pocket 104 is filled with a sealing encapsulant 140. Sealing encapsulant 140 is not shown in FIG. 1 for purposes of clarity. Sealing encapsulant 140 encloses and protects electronic components 110, 114, bond pads 116, bond wires 118, and pins 120, e.g., from being shorted and from moisture.

Sealing encapsulant 140 is formed from any one of a number of materials. Generally, sealing encapsulant 140 is formed of a flowable material, which has been cured, gelled or otherwise set-up. Illustratively, sealing encapsulant 140 is a liquid encapsulant or an adhesive such as an epoxy adhesive, which has been cured. As a further illustration, sealing encapsulant 140 is a plastic encapsulant, which is applied as a melt and then cooled to solidify.

In one embodiment, sealing encapsulant 140 is opaque. However, as discussed further below, in alternative embodiments, sealing encapsulant 140 is transparent.

Sealing encapsulant 140 includes an exterior surface 142, sometimes called a window surface. In one embodiment, exterior surface 142 has a flat glass finish, i.e., has a smoothness, sometimes called a surface roughness, approximately equal to the smoothness of glass. Exterior surface 142 is exposed to the ambient environment.

In this embodiment, exterior surface 142 is planar. Further, in this embodiment, exterior surface 142 is parallel with and coplanar with mating surface 102U of substrate 102. Exterior surface 142 is also parallel with and above upper surface 110U of electronic component of importance, the spacing between exterior surface 142 of sealing encapsulant 140 and upper surface 110U of electronic component 110 is relatively small, e.g., 150 µm, although other spacings are used in other embodiments.

As described in greater detail below with reference to FIGS. 3 and 4, due to this relatively small spacing between upper surface 110U and exterior surface 142, another structure such as a window or waveguide brought into abutting contact with exterior surface 142 is placed extremely close to and at a fixed spacing from electronic component 110. However, sealing encapsulant 140 prevents this other structure from contacting and possibly damaging electronic component 110 or bond wires 118.

Sealing encapsulant 140 and exterior surface 142 extend horizontally over runner surface 130. Accordingly, exterior surface 142 is a single planar surface, which extends horizontally over pocket 104 and runner surface 130.

However, in an alternative embodiment, instead of exterior surface 142 being an entirely planar surface, exterior surface 142 has a planar central region CR and a non-planar peripheral region PR (indicated by the dashed lines). More particularly, planar central region CR of exterior surface 142 is parallel and coplanar with mating surface 102U. Non-planar peripheral region PR is around the entire periphery of planar central region CR and slopes downwards from planar central region CR. Planar central region CR is above electronic component 110 such that any electromagnetic radiation passing through sealing encapsulant 140 to or from electronic component 110 is not distorted by exterior surface 142 as discussed in greater detail below with reference to FIGS. 3 and 4.

In yet another alternative embodiment, sealing encapsulant 140 does not extend over runner surface 130.

Overflow reservoir 122 is filled, at least partially, with an excess encapsulant 150. Excess encapsulant 150 is not shown in FIG. 1 for purposes of clarity. Excess encapsulant 150 is formed of the same material as sealing encapsulant 140. Excess encapsulant 150 has an exterior surface 152. Generally, exterior surface 152 is below mating surface 102U although, in one embodiment, exterior surface 152 is coplanar with mating surface 102U.

Figure 3:
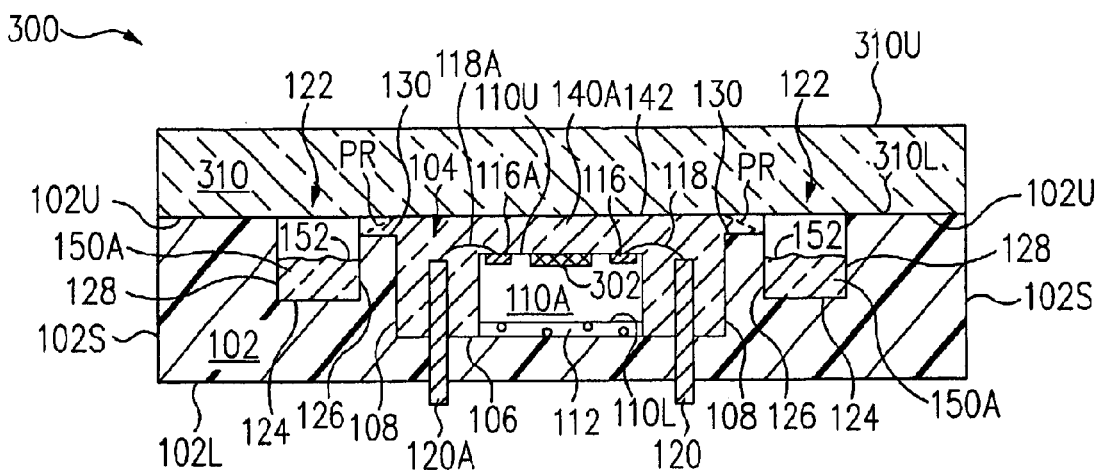
FIG. 3 is a cross-sectional view of an electronic component package in accordance with an alternative embodiment of the present invention.

FIG. 3 is a cross-sectional view of a package 300 in accordance with an alternative embodiment of the present invention. Package 300 of FIG. 3 is similar to package 100 of FIG. 2 and only the significant differences between package 300 and package 100 are discussed below.

Referring now to FIG. 3, in accordance with this embodiment, electronic device 110A, hereinafter referred to as an optical element 110A, includes an active area 302 on upper surface 110U of optical element 110A. Generally, active area 302 is a transmitter, receiver or transmitter and receiver, i.e., transceiver, of electromagnetic radiation. Optical element 110A is sometimes called an optical chip.

Also in accordance with this embodiment, a sealing encapsulant 140A is transparent. More particularly, sealing encapsulant 140A is transparent to the electromagnetic radiation of interest, e.g., to the electromagnetic radiation transmitted or received from active area 302. Since excess encapsulant 150A is formed of the same material as sealing encapsulant 140A, excess encapsulant 150A is also transparent.

Package 300 further includes a window 310. Illustratively, window 310 is a transparent structure such as a borosilicate glass window although other transparent structures are used in other embodiments.

Window 310 includes a lower, e.g., first, surface, 310L, which is planar. Lower surface 310L is in contact with mating surface 102U and is also in contact with exterior surface 142 of sealing encapsulant 140A. Window 310 also includes an upper, e.g., second, surface 310U, which is also planar.

In one embodiment, window 310 is placed extremely close to optical element 110A. For example, in certain applications, it is important to place window 310 extremely close to active area 302 of optical element 110A to prevent unacceptable loss of transmission of electromagnetic radiation between active area 302 and window 310.

Of importance, the spacing between exterior surface 142 of sealing encapsulant 140A and upper surface 110U of optical element 110A is relatively small. Accordingly, the spacing between lower surface 310L of window 310 and upper surface 110U of optical element 110A is also relatively small. Stated another way, the thickness of sealing encapsulant 140A between window 310 and optical element 110A is relatively small, e.g., 150 µm, although other thicknesses are used in other embodiments.

In one embodiment, optical element 110A is a vertical cavity surface emitting laser (VCSEL) chip. In accordance with this embodiment, electromagnetic radiation transmitted from active area 302 passes through sealing encapsulant 140A to reach window 310. Since the thickness of sealing encapsulant 140A through which the electromagnetic radiation passes is extremely small, essentially all of the electromagnetic radiation transmitted from active area 302 reaches window 310. Further, since exterior surface 142 of sealing encapsulant 140A is planar, sealing encapsulant 140A does not distort the electromagnetic radiation passing through sealing encapsulant 140A. Accordingly, package 300 is a high-performance VCSEL package in this embodiment.

In an alternative embodiment, optical element 110A is an image sensor such that active area 302 is an image array. Illustratively, optical element 110A is used to capture images, e.g., is used in consumer camera applications.

In accordance with this embodiment, electromagnetic radiation directed at package 300 passes through window 310 and passes through sealing encapsulant 140A to reach active area 302. Since the thickness of sealing encapsulant 140A through which the electromagnetic radiation passes is extremely small, essentially all of the electromagnetic radiation passing through window 310 reaches active area 302. Further, since exterior surface 142 of sealing encapsulant 140A is planar, sealing encapsulant 140A does not distort the electromagnetic radiation passing through sealing encapsulant 140A. Accordingly, package 300 is a high-performance image sensor package in this embodiment.

Although window 310 is described above as being transparent, in an alternative embodiment, window 310 functions as a lid and so can be opaque. For example, package 100 of FIGS. 1 and 2 includes an opaque lid mounted similarly to window 310.

Figure 4:
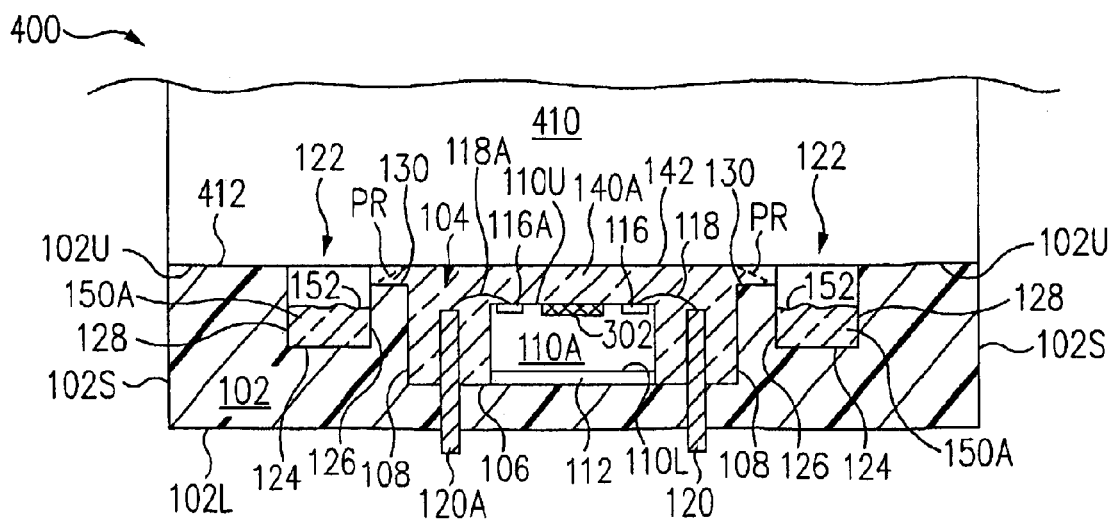
FIG. 4 is a cross-sectional view of an electronic component package in accordance with another alternative embodiment of the present invention.

FIG. 4 is a cross-sectional view of a package 400 in accordance with another alternative embodiment of the present invention. Package 400 of FIG. 4 is similar to package 300 of FIG. 3 and only the significant differences between package 400 and package 300 are discussed below.

Referring now to FIG. 4, in accordance with this embodiment, package 400 includes a waveguide 410. Waveguide 410 guides electromagnetic radiation to or from a remote location in a conventional manner. In one embodiment, waveguide 410 is a fiber optic cable.

Waveguide 410 includes a waveguide connection surface 412. In this embodiment, waveguide connection surface 412 is planar. Waveguide connection surface 412 is in contact with mating surface 102U and is also in contact with exterior surface 142 of sealing encapsulant 140A. Waveguide 410 extends from waveguide connection surface 412 to a remote location, as those of skill in the art will understand.

For reasons similar to those discussed above with regards to package 300, the spacing between waveguide connection surface 412 and upper surface 110U of optical element 110A is relatively small, e.g., 150 μm, although other spacings are used in other embodiments.

In one embodiment, optical element 110A is a VCSEL chip. In accordance with this embodiment, electromagnetic radiation transmitted from active area 302 passes through sealing encapsulant 140A to reach waveguide 410 and, more particularly, to reach waveguide connection surface 412. Since the thickness of sealing encapsulant 140A through which the electromagnetic radiation passes is extremely small, essentially all of the electromagnetic radiation transmitted from active area 302 reaches waveguide 410. Further, since exterior surface 142 of sealing encapsulant 140A is planar, sealing encapsulant 140A does not distort the electromagnetic radiation passing through sealing encapsulant 140A. Accordingly, package 400 is a high-performance VCSEL package in this embodiment.

In an alternative embodiment, optical element 110A is an image sensor such that active area 302 is an image array. In accordance with this embodiment, electromagnetic radiation from waveguide 410 passes through sealing encapsulant 140A to reach active area 302. Since the thickness of sealing encapsulant 140A through which the electromagnetic radiation passes is extremely small, essentially all of the electromagnetic radiation from waveguide 410 reaches active area 302. Further, since exterior surface 142 of sealing encapsulant 140A is planar, sealing encapsulant 140A does not distort the electromagnetic radiation passing through sealing encapsulant 140A. Accordingly, package 400 is a high-performance image sensor package in this embodiment.

Figure 5:
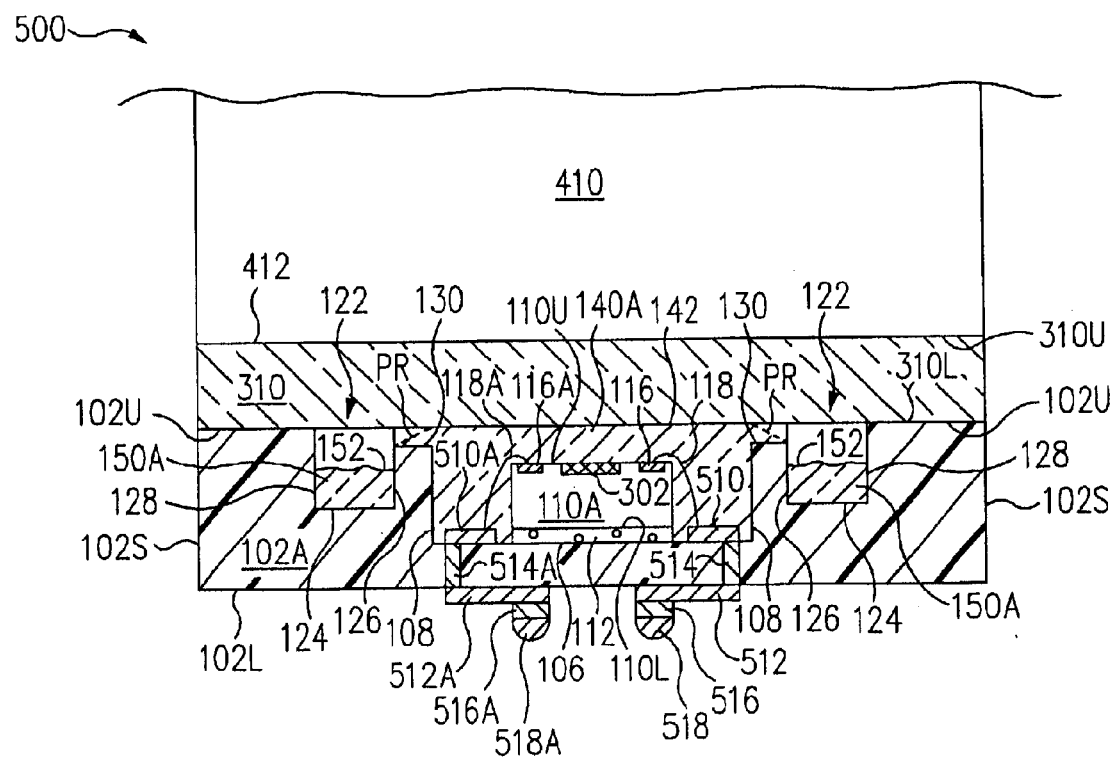
FIG. 5 is a cross-sectional view of an electronic component package in accordance with yet another alternative embodiment of the present invention.

FIG. 5 is a cross-sectional view of a package 500 in accordance with yet another alternative embodiment of the present invention. Package 500 of FIG. 5 is similar to packages 300 and 400 of FIGS. 3 and 4, respectively, and only the significant differences are discussed below.

Referring now to FIG. 5, in accordance with this embodiment, lower surface 310L of window 310 contacts mating surface 102U of a substrate 102A and also contacts exterior surface 142 of sealing encapsulant 140A in a manner similar to that described above with regards to package 300 of FIG. 3. However, in this embodiment, waveguide connection surface 412 of waveguide 410 is connected to upper surface 310U of window 310, for example, with adhesive.

Thus, any electromagnetic radiation from waveguide 410 passes through window 310 and passes through sealing encapsulant 140A to reach active area 302. Conversely, any electromagnetic radiation transmitted from active area 302 passes through sealing encapsulant 140A and through window 310 to reach waveguide 410 and, more particularly, waveguide connection surface 412.

In accordance with this embodiment, package 500 is a ball grid array (BGA) package. More particularly, formed on pocket base surface 106 of substrate 102A are a plurality of electrically conductive inner traces 510, including a first inner trace 510A. Bond pads 116 are electrically connected to inner traces 510 by bond wires 118.

To illustrate, bond pad 116A is electrically connected to inner trace 510A by bond wire 118A. The other bond pads 116 are electrically connected to the other inner traces 510 by the other bond wires 118 in a similar manner and so are not discussed further to avoid detracting from the principals of the invention.

Formed on lower surface 102L of substrate 102A are a plurality of electrically conductive outer traces 512, including a first outer trace 512A. Inner traces 510 are electrically connected to corresponding outer traces 512 by corresponding electrically conductive vias 514. To illustrate, inner trace 510A is electrically connected to outer trace 512A by a first via 514A of the plurality of vias 514. The other inner traces 510 are electrically connected to the other outer traces 512 by the other vias 514 in a similar manner and so are not discussed further to avoid detracting from the principles of the invention.

Electrically conductive interconnection pads 516 are formed on outer traces 512. Further, electrically conductive interconnection balls 518, e.g., solder, are formed on interconnection pads 516.

To illustrate, a first interconnection pad 516A of the plurality of interconnection pads 516 is formed on outer trace 512A. A first interconnection ball 518A of the plurality of interconnection balls 518 is formed on interconnection pad 516A. The other outer traces 512, interconnection pads 516 and interconnection balls 518 are formed on and electrically connected to one another in a similar manner and so are not discussed further to avoid detracting from the principals of the invention.

Although a particular electrically conductive pathway between bond pad 116A and interconnection ball 518A is described above, in light of this disclosure, it is understood that other electrically conductive pathways can be formed. For example, substrate 102A is a multi-layered laminate substrate and, instead of straight-through vias 514, a plurality of electrically conductive traces on various layers in substrate 102A are interconnected by a plurality of electrically conductive vias to form the electrical interconnections between inner traces 510 and outer traces 512.

In one embodiment, interconnection balls 518 are distributed in an array format to form a ball grid array (BGA) package. Alternatively, interconnection balls 518 are not formed, e.g., to form a metal land grid array (LGA) package or a leadless chip carrier (LCC) package. In another alternative, interconnection pads 516 are not formed and interconnection balls 518 are formed directly on outer traces 512. Further, contact metallizations are interposed between the various conductors in other embodiments. Other electrically conductive pathway modifications will be obvious to those of skill in the art. Further, dielectric layers can be used to protect the various conductors, e.g., solder mask(s) on pocket base surface 106 and/or on lower surface 102L.

Although packages 100, 300, and 400 of FIGS. 2, 3, and 4, respectively, are illustrated as having pins 120, in alternative embodiments, instead of having pins 120, packages 100, 300, and 400 of FIGS. 2, 3, and 4, respectively, are formed as BGA, LGA, LCC or other style packages in a manner similar to that discussed above with regards to package 500 of FIG. 5. Similarly, instead of having inner traces 510, outer traces 512, vias 514, interconnection pads 516 and interconnection balls 518, package 500 of FIG. 5 can be formed with pins 120 in a manner similar to that discussed above with regards to package 100 of FIG. 2.

Figure 6:
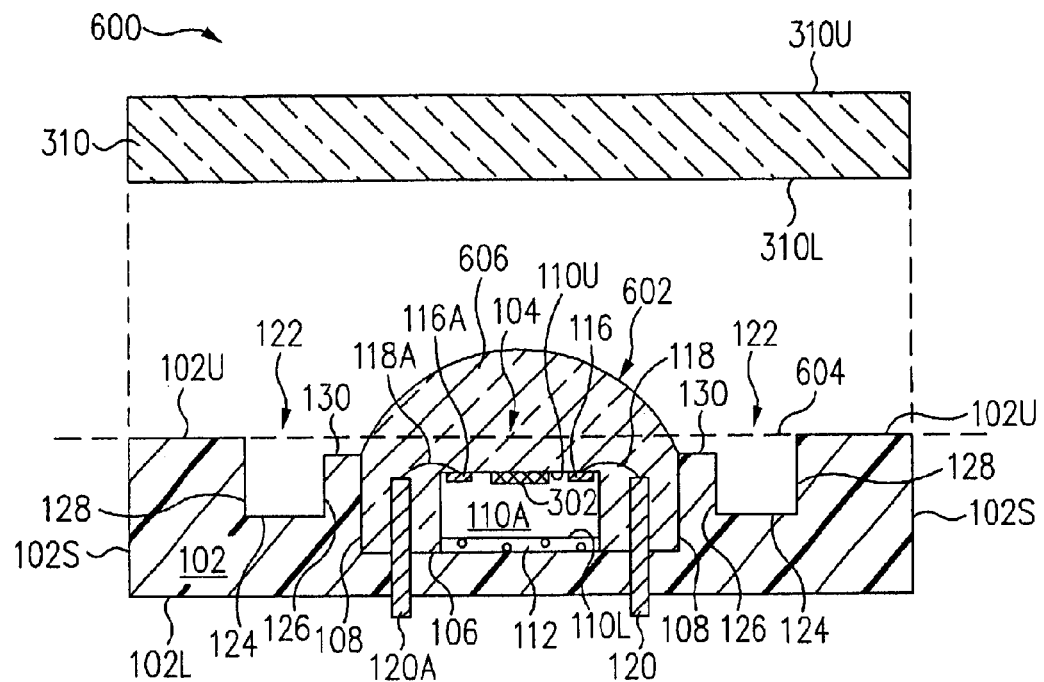
FIG. 6 is a cross-sectional view of an electronic component package during fabrication in accordance with one embodiment of the present invention.

FIG. 6 is a cross-sectional view of a package 600 during fabrication in accordance with one embodiment of the present invention. Referring now to FIG. 6, lower surface 110L of optical element 110A is mounted to pocket base surface 106 of substrate 102 with adhesive layer 112. Bond pads 116 of optical element 110A are wirebonded to pins 120 with bond wires 118.

Pocket 104 is filled with a flowable, sometimes called uncured, material 602. Illustratively, flowable material 602 is an uncured liquid encapsulant or an uncured adhesive such as an epoxy adhesive. As a further illustration, flowable material 602 is a plastic encapsulant, which has been heated to a melt. Generally, flowable material 602 is a material that has the ability to flow when squeezed as discussed further below. Flowable material 602 is applied using any one of a variety of techniques, e.g., is applied with a needle dispenser.

Flowable material 602 encloses optical element 110A, bond wires 118, pins 120, pocket sidewall surface 108 and any exposed portions of pocket base surface 106. A sufficient amount of flowable material 602 is applied to overfill pocket 104. More particularly, after application, flowable material 602 forms a domelike glob, which protrudes above pocket 104.

Flowable material 602 protrudes above pocket 104 to a height above a plane 604 defined by mating surface 102U of substrate 102. The volume of flowable material 602 above plane 604 is excess flowable material 606.

Window 310 is aligned with substrate 102. More particularly, window 310 is aligned above pocket 104, runner surface 130, overflow reservoir 122, and at least a portion of mating surface 102U as shown in FIG. 6.

Figure 7:
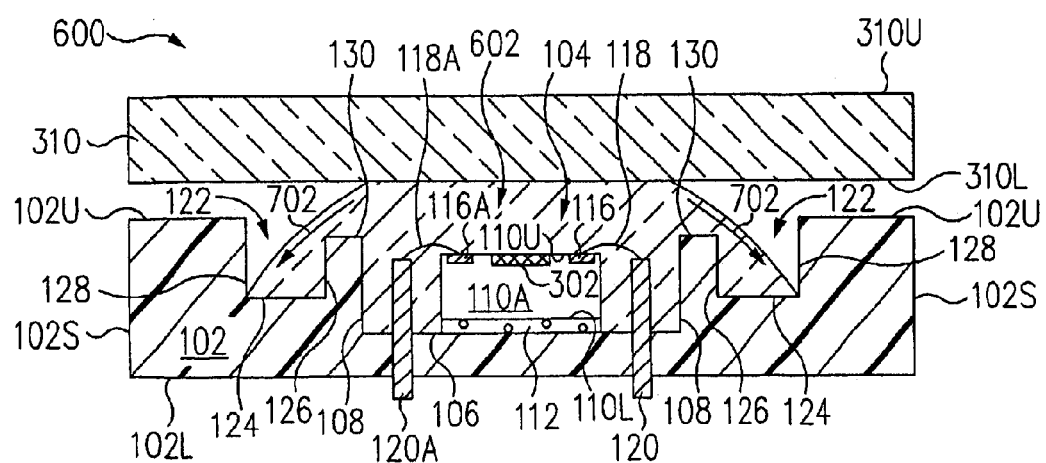
FIGS. 7, 8 and 9 are cross-sectional views of the electronic component package of FIG. 6 at later stages during fabrication in accordance with various embodiments of the present invention.

FIG. 7 is a cross-sectional view of package 600 of FIG. 6 at a later stage during fabrication in accordance with one embodiment of the present invention. Referring now to FIGS. 6 and 7 together, window 310 is moved towards substrate 102. During this motion of window 310, lower surface 310L of window 310 contacts excess flowable material 606 and, more generally, contacts flowable material 602. Continued motion of window 310 towards substrate 102 squeezes flowable material 602 between window 310 and substrate 102. As a result of this squeezing, flowable material 602 overflows pocket 104.

As indicated by the arrows 702 in FIG. 7, flowable material 602 spills out of pocket 104 and flows over runner surface 130 and into overflow reservoir 122. Overflow reservoir 122 captures any and all of flowable material 602 that flows out of pocket 104.

Window 310 is moved thus squeezing flowable material 602 between window 310 and substrate 102 until lower surface 310L of window 310 contacts mating surface 102U of substrate 102. Once window 310 contacts mating surface 102U of substrate 102, further motion of window 310 towards substrate 102 is prevented.

Figure 8:
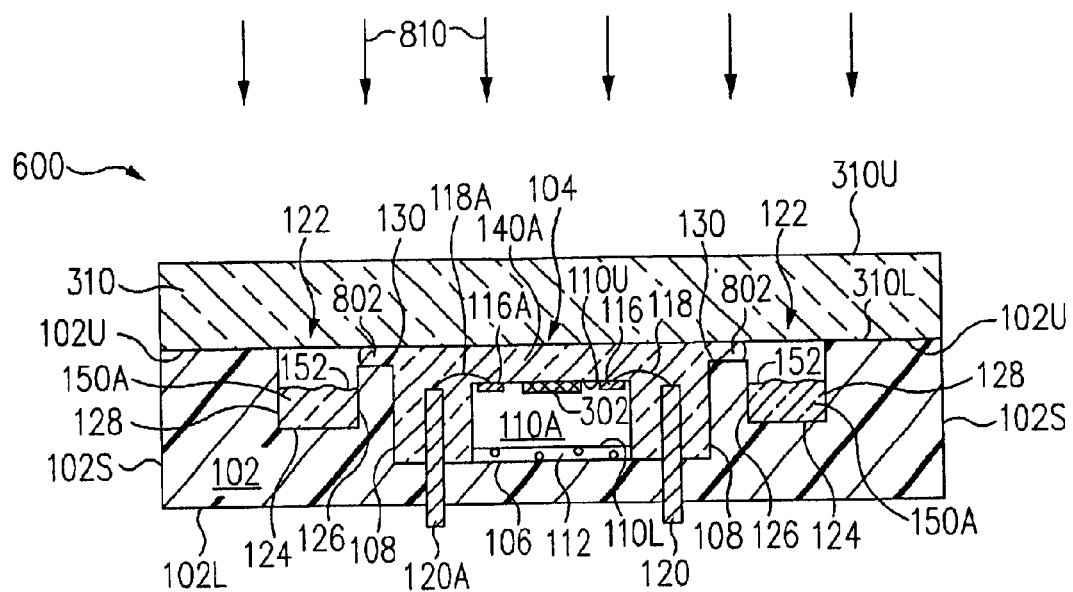

FIG. 8 is a cross-sectional view of package 600 of FIG. 7 at a later stage during fabrication in accordance with one embodiment of the present invention. As shown in FIG. 8, even after window 310 contacts mating surface 102U of substrate 102, a pressure relief channel 802 remains. Specifically, pressure relief channel 802 is defined by lower surface 310L of window 310 and runner surface 130 of substrate 102, which are spaced apart from one another.

Referring now to FIGS. 7 and 8 together, to the extent flowable material 602 became pressurized in pocket 104 during mounting of window 310, flowable material 602 continues to flow through pressure relief channel 802 from pocket 104 into overflow reservoir 122 thus dissipating the pressure. By dissipating the pressure, any possibility of flowable material 602 pushing window 310 from mating surface 102U of substrate 102 is eliminated.

Overflow reservoir 122 has a volume sufficient to capture all of flowable material 602 that spills out of pocket 104 during mounting of window 310. More particularly, referring again to FIG. 6, the volume of flowable material 602 that spills out of pocket 104 approximately equals the volume of excess flowable material 606. Further, the volume of overflow reservoir 122 is at least as great as the volume of excess flowable material 606. Accordingly, referring now to FIGS. 7 and 8, overflow reservoir 122 is not entirely filled by flowable material 602. In this manner, overflow reservoir 122 prevents flowable material 602 from contacting and contaminating mating surface 102U.

Advantageously, flowable material 602 entirely fills the region between optical element 110A and window 310. At the same time, flowable material 602 does not spill over on to mating surface 102U. This ensures that window 310 directly contacts and is seated against mating surface 102U. Accordingly, window 310 is mounted to substrate 102 to extremely tight tolerance such that the spacing between lower surface 310L of window 310 and upper surface 110U of optical element 110A is extremely precise, e.g., 150 μm, although other spacings are used in other embodiments.

Flowable material 602 is cured, gelled or otherwise set-up to form sealing encapsulant 140A and excess encapsulant 150A. In one embodiment, flowable material 602, e.g., an ultraviolet sensitive adhesive, is cured by irradiating flowable material 602 with electromagnetic radiation 810, e.g., ultraviolet radiation. Advantageously, electromagnetic radiation 810 readily passes through window 310 to reach and cure flowable material 602.

However, in alternative embodiments, flowable material 602 is cured using other techniques. In one embodiment, flowable material 602, e.g., an adhesive, is cured by heating. Alternatively, flowable material 602, e.g., a molten plastic encapsulant, is cured by cooling.

At this stage in fabrication, package 600 of FIG. 8 is similar to package 300 of FIG. 3. Stated another way, package 300 of FIG. 3 is fabricated in a manner similar to that described above with regards to package 600 in one embodiment.

Further, instead of fabricating package 600 with window 310, in an alternative embodiment, package 600 is fabricated with waveguide 410 in a similar manner to that described above. Accordingly, package 400 of FIG. 4 is fabricated in a manner similar to that described above with regards to package 600 in one embodiment.

Figure 9:
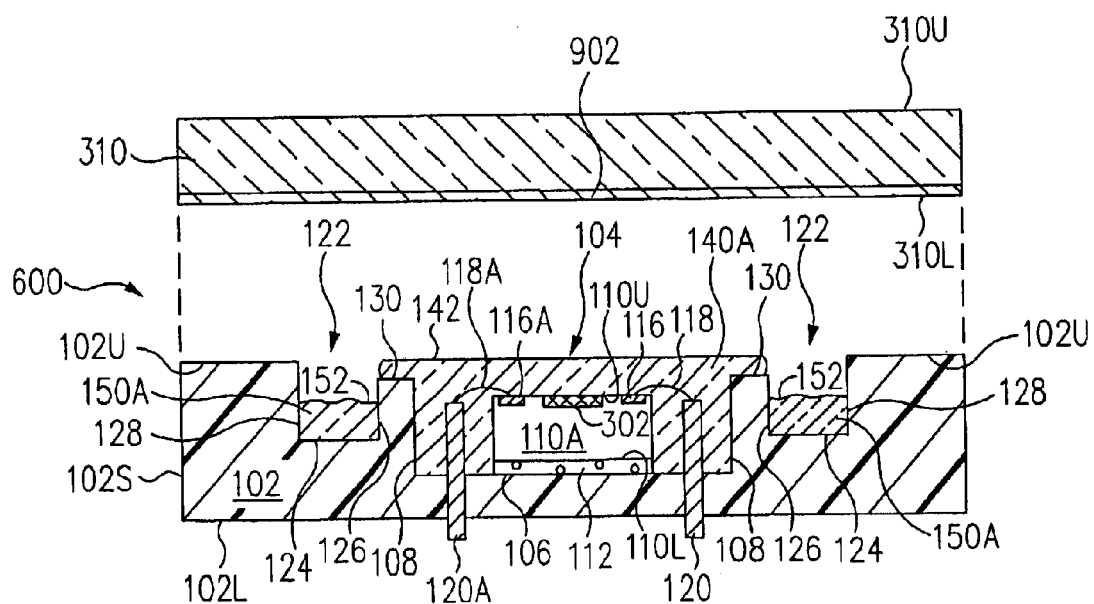

In one embodiment, after curing of flowable material 602, window 310 is removed. FIG. 9 is a cross-sectional view of package 600 of FIG. 8 at a later stage during fabrication in accordance with this embodiment of the present invention. Referring now to FIG. 9, removal of window 310 leaves sealing encapsulant 140A with a smooth and planar exterior surface 142, which is coplanar with mating surface 102U.

To facilitate this removal of window 310, in one embodiment, lower surface 310L of window 310 includes a release agent 902 such as wax.

After removal of window 310, package 600 of FIG. 9 is similar to package 100 of FIGS. 1 and 2. Stated another way, package 100 of FIGS. 1 and 2 is fabricated in a manner similar to that described above with regards to package 600 in one embodiment.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A package comprising:
   a substrate comprising:
      a pocket;
      an overflow reservoir around a periphery of said pocket; and
      a mating surface around a periphery of said overflow reservoir;
   a first electronic component coupled within said pocket;
   a sealing encapsulant filling said pocket, said sealing encapsulant comprising an exterior surface coplanar with said mating surface; and
   excess encapsulant within said overflow reservoir, wherein said excess encapsulant comprises an exterior surface below said mating surface.

2. The package of claim 1 further comprising a second electronic component coupled within said pocket.

3. The package of claim 1 wherein said first electronic component is coupled within said pocket in a configuration selected from the group consisting of a wirebond configuration, a surface mount configuration and a flip chip configuration.

4. The package of claim 1 wherein said substrate further comprises:
   a pocket base surface; and
   a pocket sidewall surface, said pocket base surface and said pocket sidewall surface defining said pocket.

5. The package of claim 1 wherein said sealing encapsulant comprises a cured flowable material.

6. The package of claim 1 wherein said exterior surface of said sealing encapsulant has a smoothness approximate equal to a smoothness of glass.

7. The package of claim 1 wherein said sealing encapsulant is opaque.

8. The package of claim 1 wherein said excess encapsulant is formed of a same material as said sealing encapsulant.

9. The package of claim 1 wherein said substrate further comprises:
   a pocket base surface;
   a pocket sidewall surface, said pocket base surface and said pocket sidewall surface defining said pocket;
   a drain base surface;
   a drain inner sidewall surface;
   a drain outer sidewall surface, said drain base surface, said drain inner sidewall surface, and said drain outer sidewall surface defining said overflow reservoir; and
   a runner surface extending between said drain inner sidewall surface and said pocket sidewall surface.

10. The package of claim 4 wherein said first electronic component comprises a first surface comprising a bond pad and a second surface coupled to said pocket base surface, said package further comprising:
    a pin extending through said pocket base surface and through said substrate and protruding from a lower surface of said substrate; and
    a bond wire electrically coupling said bond pad to said pin.

11. The package of claim 4 wherein said first electronic component comprises a first surface comprising a bond pad and a second surface coupled to said pocket base surface, said package further comprising:
    an inner trace coupled to said pocket base surface;
    a bond wire electrically coupling said bond pad to said inner trace; and
    an outer trace coupled to a lower surface of said substrate, said inner trace being electrically coupled to said outer trace.

12. The package of claim 9 wherein said runner surface extends between said pocket and said overflow reservoir.

13. The package of claim 9 wherein said mating surface extends from said drain outer sidewall surface.

14. The package of claim 9 wherein said pocket base surface is below said drain base surface.

15. The package of claim 11 further comprising an interconnection pad coupled to said outer trace.

16. The package of claim 11 further comprising an interconnection ball coupled to said outer trace.

17. A package comprising:
    a substrate comprising:
       a pocket;
       a pocket base surface;
       a pocket sidewall surface, said pocket base surface and said pocket sidewall surface defining said pocket;
       an overflow reservoir around a periphery of said pocket;
       a drain base surface;
       a drain inner sidewall surface;
       a drain outer sidewall surface, said drain base surface, said drain inner sidewall surface, and said drain outer sidewall surface defining said overflow reservoir;
       a mating surface around a periphery of said overflow reservoir and extending from said drain outer sidewall surface; and
       a runner surface extending between said drain inner sidewall surface and said pocket sidewall surface, wherein said runner surface is below said mating surface;
    a first electronic component coupled within said pocket;
    a sealing encapsulant filling said pocket, said sealing encapsulant comprising an exterior surface coplanar with said mating surface; and
    excess encapsulant within said overflow reservoir.

18. A package comprising:
    a substrate comprising:
       a pocket;
       an overflow reservoir around a periphery of said pocket;
       a runner surface extending between said pocket and said overflow reservoir; and
       a mating surface around a periphery of said overflow reservoir;
    a first electronic component coupled within said pocket;
    a sealing encapsulant filling said pocket, said sealing encapsulant extending over and above said runner surface; and
    excess encapsulant within said overflow reservoir.

19. The package of claim 18 wherein said sealing encapsulant comprises an entirely planar exterior surface extending over and above said runner surface.

20. The package of claim 18 wherein said sealing encapsulant comprises an exterior surface, said exterior surface comprising a planar central region and a non-planar peripheral region.

* * * * *